(12) United States Patent
Takemoto

(10) Patent No.: US 10,916,508 B2
(45) Date of Patent: Feb. 9, 2021

(54) SEMICONDUCTOR DEVICE PACKAGE WITH RADIATION SHIELD

(71) Applicant: TOSHIBA MEMORY CORPORATION, Minato-ku, Tokyo (JP)

(72) Inventor: Yasuo Takemoto, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 9 days.

(21) Appl. No.: 16/114,053

(22) Filed: Aug. 27, 2018

(65) Prior Publication Data

US 2019/0287922 A1   Sep. 19, 2019

(30) Foreign Application Priority Data

Mar. 15, 2018 (JP) .................. 2018-048194

(51) Int. Cl.
| | |
|---|---|
| *H01L 23/556* | (2006.01) |
| *H01L 23/538* | (2006.01) |
| *H01L 21/56* | (2006.01) |
| *H01L 23/00* | (2006.01) |
| *H01L 25/18* | (2006.01) |
| *H01L 25/00* | (2006.01) |
| *H01L 23/29* | (2006.01) |

(52) U.S. Cl.
CPC .......... *H01L 23/556* (2013.01); *H01L 21/563* (2013.01); *H01L 23/295* (2013.01); *H01L 23/5389* (2013.01); *H01L 24/11* (2013.01); *H01L 24/14* (2013.01); *H01L 24/27* (2013.01); *H01L 24/32* (2013.01); *H01L 24/48* (2013.01); *H01L 24/83* (2013.01); *H01L 25/18* (2013.01); *H01L 25/50* (2013.01); *H01L 2224/13099* (2013.01); *H01L 2224/325* (2013.01); *H01L 2224/48599* (2013.01); *H01L 2924/01028* (2013.01); *H01L 2924/01029* (2013.01); *H01L 2924/1434* (2013.01)

(58) Field of Classification Search
CPC ..................................................... H01L 23/556
USPC ........................................................... 257/660
See application file for complete search history.

(56) References Cited

U.S. PATENT DOCUMENTS

| | | |
|---|---|---|
| 6,204,564 B1 | 3/2001 | Miyata et al. |
| 8,193,617 B2 | 6/2012 | Yamano |
| (Continued) | | |

FOREIGN PATENT DOCUMENTS

| | | |
|---|---|---|
| JP | S55-143053 A | 11/1980 |
| JP | S63-262867 A | 10/1988 |
| (Continued) | | |

*Primary Examiner* — Ajay Arora
(74) *Attorney, Agent, or Firm* — Foley & Lardner LLP

(57) ABSTRACT

A semiconductor device includes a substrate and a semiconductor chip. The semiconductor chip includes a semiconductor element on a first surface thereof. The semiconductor chip is provided on the substrate such that a second surface thereof, which is opposite to the first surface, faces an upper surface of the substrate. A metal layer is provided between the second surface of the semiconductor chip and the upper surface of the substrate. A metal material, in which the range of α rays is shorter than for single-crystal silicon, is used in the metal layer.

13 Claims, 8 Drawing Sheets

(56) References Cited

U.S. PATENT DOCUMENTS

| | | | | |
|---|---|---|---|---|
| 2003/0114606 A1* | 6/2003 | Taniguchi | ............ | C08G 59/4071 |
| | | | | 525/523 |
| 2006/0263944 A1* | 11/2006 | Lange | .................... | H01L 24/32 |
| | | | | 438/125 |
| 2008/0241359 A1* | 10/2008 | Card | ...................... | H01C 1/144 |
| | | | | 427/97.4 |
| 2012/0256306 A1* | 10/2012 | Yu | ........................ | H01L 23/3107 |
| | | | | 257/676 |
| 2014/0124906 A1* | 5/2014 | Park | ...................... | H01L 23/552 |
| | | | | 257/659 |

FOREIGN PATENT DOCUMENTS

| | | |
|---|---|---|
| JP | H01-057650 A | 3/1989 |
| JP | H09-036315 A | 2/1997 |
| TW | 200408057 A | 5/2004 |

* cited by examiner

SEMICONDUCTOR DEVICE PACKAGE WITH RADIATION SHIELD

CROSS-REFERENCE TO RELATED APPLICATION

This application is based upon and claims the benefit of priority from Japanese Patent Application No. 2018-048194, filed Mar. 15, 2018, the entire contents of which are incorporated herein by reference.

FIELD

Embodiments described herein relate generally to a semiconductor device.

BACKGROUND

A semiconductor device may include a semiconductor chip provided on a substrate, and is packaged by sealing the semiconductor chip with a resin. A resin material including a glass fiber may be used in the substrate. In addition, an adhesive layer including a glass filler may be interposed between the semiconductor chip and the substrate. A glass material contained in the substrate or the adhesive layer may emit radiation such as α rays in some cases.

Examples of related art include JP-A-1988-262867, JP-A-1989-057650, JP-A-2010-074120 (U.S. Pat. No. 8,193,617), U.S. Pat. No. 6,204,564, and JP-A-1997-036315.

DETAILED DESCRIPTION

Figure 1:
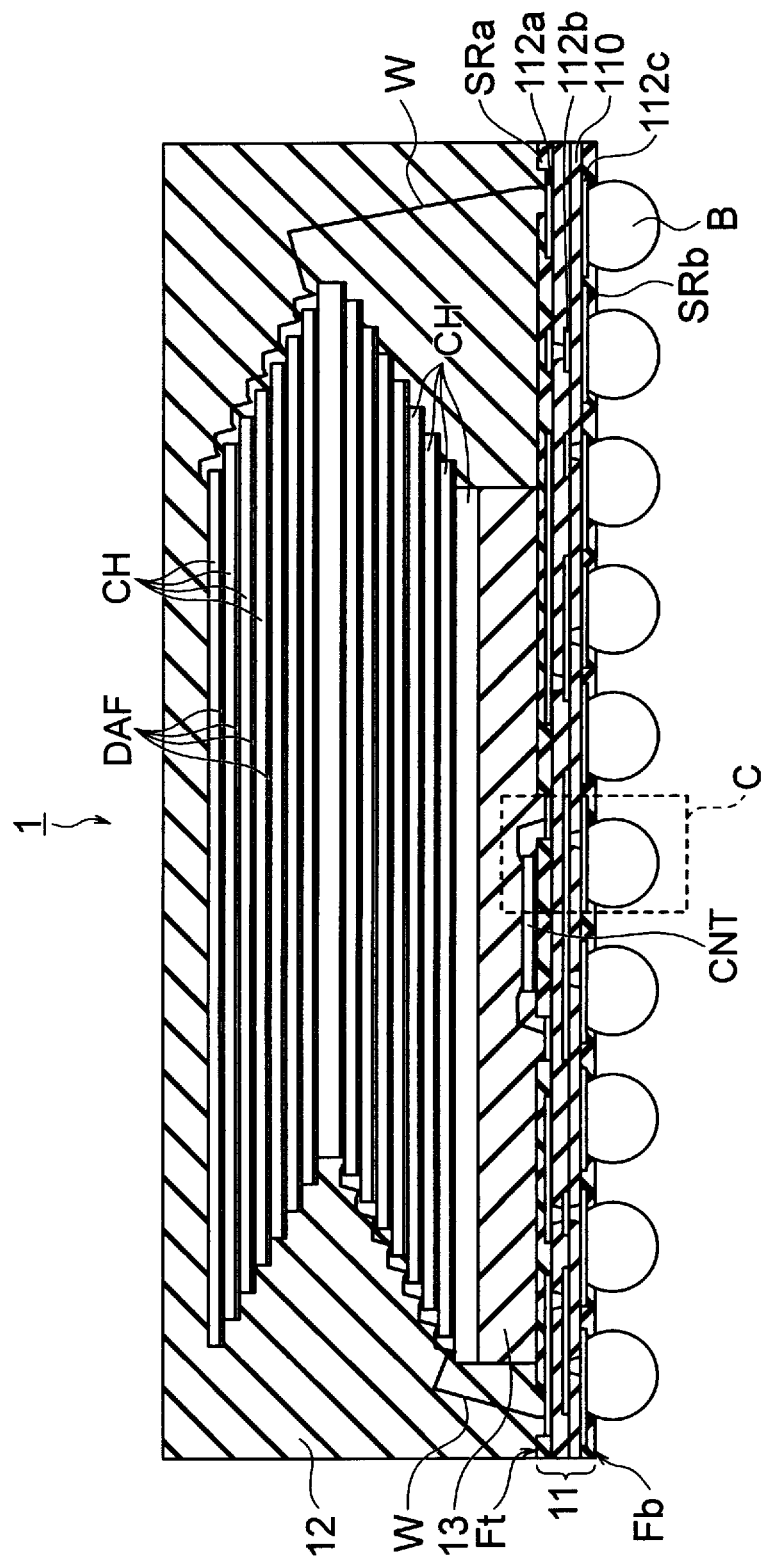
FIG. 1 is a cross-sectional view illustrating an example of a configuration of a semiconductor device according to a first embodiment.

At least one embodiment provides a semiconductor device capable of preventing the influence of radiation from a substrate or an adhesive layer.

In general, according to at least one embodiment, a semiconductor device includes a substrate and a semiconductor chip. The semiconductor chip includes a semiconductor element on a first surface thereof. The semiconductor chip is provided on the substrate such that a second surface thereof, which is opposite to the first surface, faces an upper surface of the substrate. A metal layer is provided between the second surface of the semiconductor chip and the upper surface of the substrate. A metal material, for which the range of α rays is shorter than for single-crystal silicon, is used in the metal layer.

Hereinafter, embodiments disclosed herein will be described with reference to the drawings. The embodiments do not limit the disclosure. In the following embodiments, the vertical direction of a substrate indicates the relative direction when the surface, on which a semiconductor chip is provided, is directed upward, and may be different from the vertical direction depending on the gravitational acceleration. The drawings are schematic or conceptual, and the ratio of each part is not necessarily the same as the actual ratio. In the specification and the drawings, elements similar to those described above with reference to the drawings are given the same reference numerals, and a detailed description thereof will be omitted as appropriate.

First Embodiment

FIG. 1 is a cross-sectional view illustrating an exemplary configuration of a semiconductor device 1 according to a first embodiment. The semiconductor device 1 may be, for example, a semiconductor memory such as, for example, an NAND-type Electrically Erasable Programmable Read-Only Memory (EEPROM). In this case, the semiconductor device 1 includes a memory controller CNT and a plurality of stacked memory chips CH in one package. In addition, the semiconductor device 1 may include a substrate 11, a wire W, resin layers 12 and 13, a metal bump B, and an adhesion-layer Die-Attachment-Film (DAF).

The substrate 11 may include a plurality of wiring layers 112a to 112c, a resin layer 110, and solder resist layers SRa and SRb. The wiring layers 112a to 112c are wired so as to electrically interconnect an arbitrary wire W and an arbitrary metal bump B. A conductive metal such as, for example, copper or tungsten is used in the wiring layers 112a to 112c. The resin layer 110 is provided between the wiring layers 112a to 112c, or on the surfaces thereof. An insulating glass resin material, in which a resin contains a glass fiber such as, for example, a glass epoxy resin, is used in the resin layer 110.

The memory controller CNT and the plurality of memory chips CH are stacked on an upper surface Ft of the substrate 11. The memory controller CNT as a semiconductor chip is provided under the plurality of stacked memory chips CH, and is covered with the resin layer 13. The memory controller CNT controls operations of the plurality of memory chips CH. The plurality of memory chips CH are provided on and bonded to the resin layer 13. The plurality of memory chips CH are stacked in the longitudinal direction (the direction substantially perpendicular to the upper surface Ft of the substrate 11) by the adhesive layer DAF.

As illustrated in FIG. 1, the plurality of memory chips CH are stacked in a staggered shape and are then stacked so as to be staggered in the opposite direction from the middle thereof. Thereby, it is possible to prevent one memory chip CH from being superimposed on an electrode pad (not illustrated) of another memory chip CH, thereby enabling the wire w to be connected to the electrode pad of each memory chip CH. The memory chips CH may be, for example, memory chips having the same configuration. The memory chips may be, for example, NAND-type EEPROM chips having a three-dimensional memory cell array in which memory cells are three-dimensionally arranged.

The wire W is bonded between the electrode pad of the memory chip CH or the memory controller CNT and an electrode pad (not illustrated) on the wiring layer 112a of the substrate 11, and electrically interconnects the two. A conductive metal such as, for example, gold is used in the wire W.

The resin layer 12 seals the memory chip CH and the wire W on the substrate 11 and the resin layer 13. Thereby, the resin layer 12 protects the memory controller CNT, the memory chip CH, and the wire W from external shocks or outside air.

The metal bump B is provided on a lower surface Fb of the substrate 11 opposite to the upper surface Ft, and is electrically connected to a portion of the wiring layer 112c. The metal bump B is provided in order to electrically connect the semiconductor device 1 to, for example, an external mounting board (not illustrated). A conductive metal such as, for example, a solder is used in the metal bump B.

Figure 2:
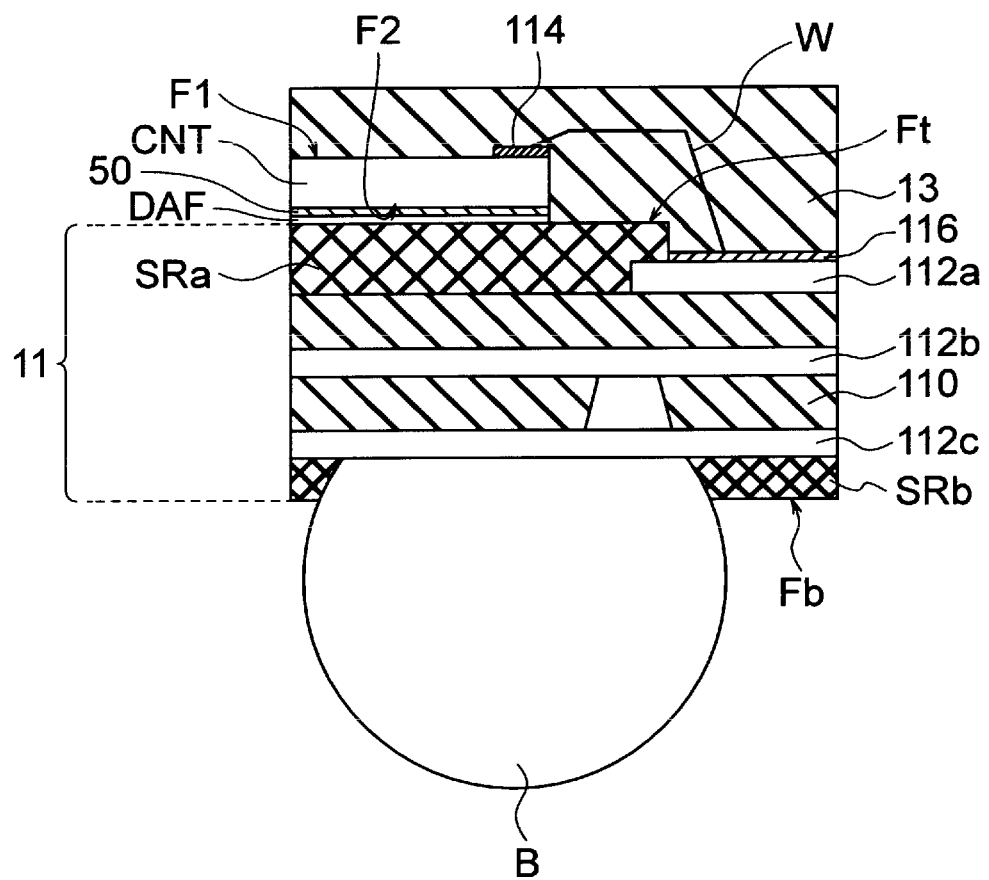
FIG. 2 is a cross-sectional view illustrating a configuration in broken-line frame C of FIG. 1 in more detail.

FIG. 2 is a cross-sectional view illustrating a configuration in broken-line frame C of FIG. 1 in more detail. The semiconductor device 1 further includes a metal layer 50 and the adhesive layer DAF, which are provided between the memory controller CNT and the substrate 11.

The substrate 11 further includes the solder resist layer SRa provided on the upper surface Ft side and the solder resist layer SRb provided on the lower surface Fb side. The solder resist layers SRa and SRb may include, for example, a glass filler. The memory controller CNT is provided above the solder resist layer SRa.

The memory controller CNT includes a first surface F1 and a second surface F2 opposite to the first surface F1. A semiconductor element (not illustrated) is provided on the first surface F1 of the memory controller CNT. For example, the memory controller CNT includes, as a semiconductor element, a control circuit for controlling the memory chip CH or an SRAM for temporarily storing data therein. The memory controller CNT is bonded on the substrate 11 such that the second surface F2 faces the upper surface Ft of the substrate 11.

The metal layer 50 is provided between the second surface F2 of the memory controller CNT and the upper surface Ft of the substrate 11. In the embodiment, the metal layer 50 covers the entirety of the second surface F2 of the memory controller CNT. A metal material, for which the range of α rays is shorter than for single-crystal silicon, is used in the metal layer 50. For example, assuming that the density of a certain material is "ρ", the range of α-rays in air is "R", and the atomic weight of the material is "A", the range Rs of α-rays in this material is represented by Equation 1. Equation 1 is a so-called Bragg-Kleeman Equation.

$$Rs=(3.2\times10^{-4}\times R\times A^{1/2})/\rho \quad \text{(Equation 1)}$$

The material of the metal layer 50 is selected so that the Rs of the material is smaller than the Rs of the single-crystal silicon.

Here, the reason why the metal material, for which the range of α rays is shorter than for single-crystal silicon, is used in the metal layer 50 will be described.

When a silicon substrate of the semiconductor chip is thin, α rays pass through the silicon substrate and reach a circuit on the surface of the semiconductor chip. In this case, α rays may cause the circuit of the semiconductor chip to malfunction, thereby causing a soft error. To prevent this, it is also conceivable to configure the substrate with a material, which passes less radiation such as, for example, α rays. However, such a substrate material is expensive and has problems in properties such as, for example, warpage or reliability.

As described above, the substrate 11 and the solder resist layers SRa and SRb may include a glass fiber or a glass filler to discharge radiation such as, for example, α rays. For example, α rays may pass through the silicon substrate of the memory controller CNT and reach the circuit such as, for example, the SRAM provided on the first surface F1 thereof. In this case, α rays may have an adverse effect on the data stored in the SRAM of the memory controller CNT, thereby causing a soft error.

The silicon substrate, used in the memory controller CNT, is made thinner with the miniaturization of the semiconductor device 1, and the thickness thereof ranges from about 30 μm to 40 μm. The α rays from the solder resist layer SRa or a resin layer 110 of the substrate 11 may pass through the thin silicon substrate having a film thickness ranging from about 40 μm or less and reach the circuit of the memory controller CNT.

Therefore, in the semiconductor device 1 according to at least one embodiment, the metal layer 50, for which the range of α rays is shorter than for single-crystal silicon, is provided between the memory controller CNT and the substrate 11. Thereby, the metal layer 50 may absorb α rays, thereby preventing α rays from reaching the circuit such as, for example, the SRAM provided on the first surface F1 of the memory controller CNT. As a result, it is possible to prevent the loss of data in the SRAM of the memory controller CNT or malfunction of the circuit.

For example, copper or nickel may be considered as the metal material, for which the range of α rays is shorter than for single-crystal silicon. In addition, when copper or nickel is used as the material of the metal layer 50, the film thickness of the metal layer 50 may range from several μm to 20 μm, for example.

The memory controller CNT, which includes the metal layer 50 on the second surface F2 thereof, is bonded on the solder resist layer SRa by the adhesive layer DAF.

The wire W is electrically connected between an electrode pad 114 on the first surface F1 of the memory controller CNT and an electrode pad 116 on the wiring layer 112a. The resin layer 13 bonds the lowermost memory chip CH on the substrate 11, and also covers and protects the memory controller CNT and the wire W.

Next, a method of manufacturing the semiconductor device 1 according to at least one embodiment will be described.

FIGS. 3A to 6B are perspective views and cross-sectional views schematically illustrating an exemplary method of manufacturing the semiconductor device 1 according to the first embodiment. First, a semiconductor element is formed on the first surface F1 of a silicon substrate 101. The semiconductor element is a circuit element required for the memory controller CNT.

Figure 3A:
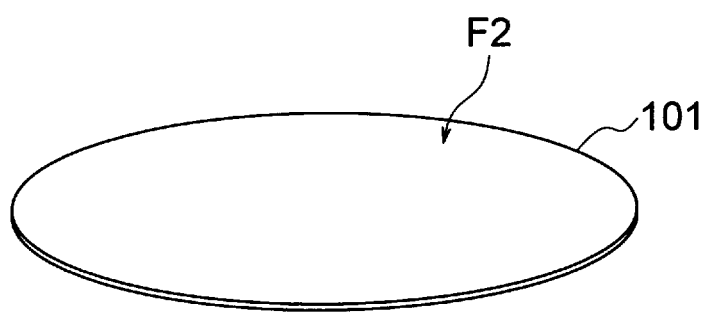
FIGS. 3A and 3B are perspective views schematically illustrating an example of a method of manufacturing the semiconductor device according to the first embodiment.

Subsequently, as illustrated in FIG. 3A, the second surface F2 of the silicon substrate 101 is polished using a Chemical Mechanical Polishing (CMP) method, for example. Thereby, the thickness of the silicon substrate 101 is reduced to about 20 μm to 40 μm.

Figure 3B:

Subsequently, as illustrated in FIG. 3B, the metal layer 50 is formed on the second surface F2 of the silicon substrate 101. Thereby, the metal layer 50 is formed on the second surface F2 of the silicon substrate 101. The metal layer 50 is formed using a sputtering method or a plating method, for example. As described above, the metal layer 50 is, for example, copper or nickel having a film thickness ranging from several μm to 20 μm.

Figure 4A:
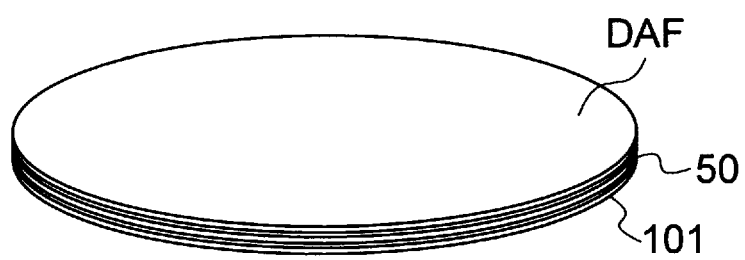
FIGS. 4A and 4B are perspective views schematically illustrating the example of the method of manufacturing the semiconductor device continued from FIGS. 3A and 3B.

Subsequently, as illustrated in FIG. 4A, the adhesive layer DAF is attached on the metal layer 50. Subsequently, a dicing tape (not illustrated) is attached to the metal layer 50 on the second surface F2 side of the silicon substrate 101. Alternatively, a dicing tape, to which the adhesive layer DAF is attached, is attached to the metal layer 50 on the second surface F2 side of the silicon substrate 101.

Figure 4B:
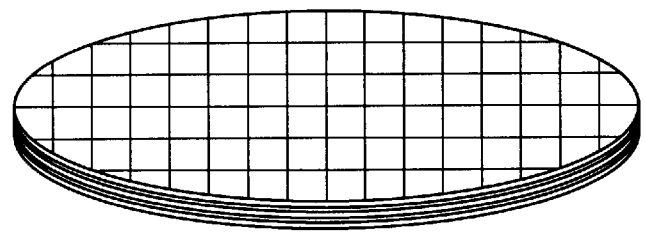

Subsequently, as illustrated in FIG. 4B, the silicon substrate 101 is divided into individual chips using a dicing blade or a dicing laser, for example. Thereby, the memory controller CNT as a chip is completed.

Figure 5A:
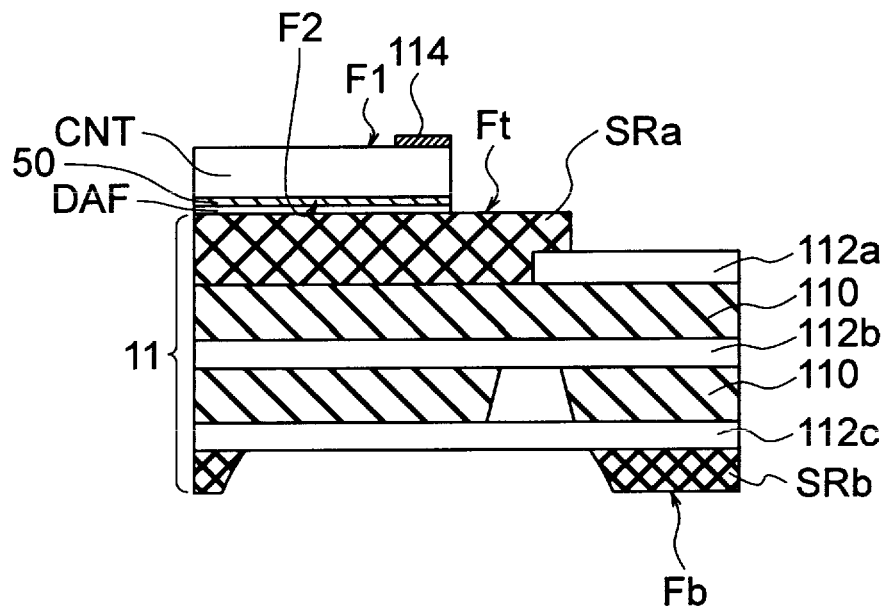
FIGS. 5A and 5B are cross-sectional views schematically illustrating the example of the method of manufacturing the semiconductor device continued from FIGS. 4A and 4B.

Subsequently, the substrate 11 is prepared. The substrate 11 includes the solder resist layers SRa and SRb provided respectively on the upper surface Ft and the lower surface Fb thereof. The solder resist layers SRa and SRb are processed using a lithography technique, as illustrated in FIG. 5A.

Subsequently, the memory controller CNT as a chip, which is divided as illustrated in FIG. 4B, is placed on the solder resist layer SRa of the substrate 11. At this time, the memory controller CNT is bonded on the solder resist layer SRa by the adhesive layer DAF. The metal layer 50 is interposed between the second surface F2 of the memory controller CNT and the adhesive layer DAF. As described above, the metal layer 50 is a material, which is smaller than single-crystal silicon in the Rs of Equation 1, such as, for example, copper or nickel. The film thickness of the metal layer 50 ranges from several μm to 20 μm, for example. Thereby, the metal layer 50 prevents α rays from the substrate 11 from reaching the circuit provided on the first surface F1 side of the memory controller CNT.

Figure 5B:
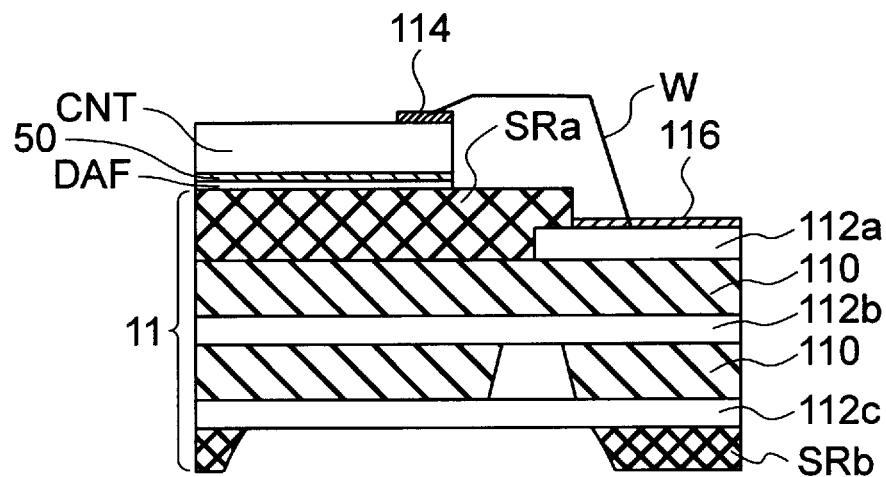

Subsequently, as illustrated in FIG. 5B, the electrode pad 114 of the memory controller CNT and the electrode pad 116 of the substrate 11 are connected to each other with the wire W.

Figure 6A:
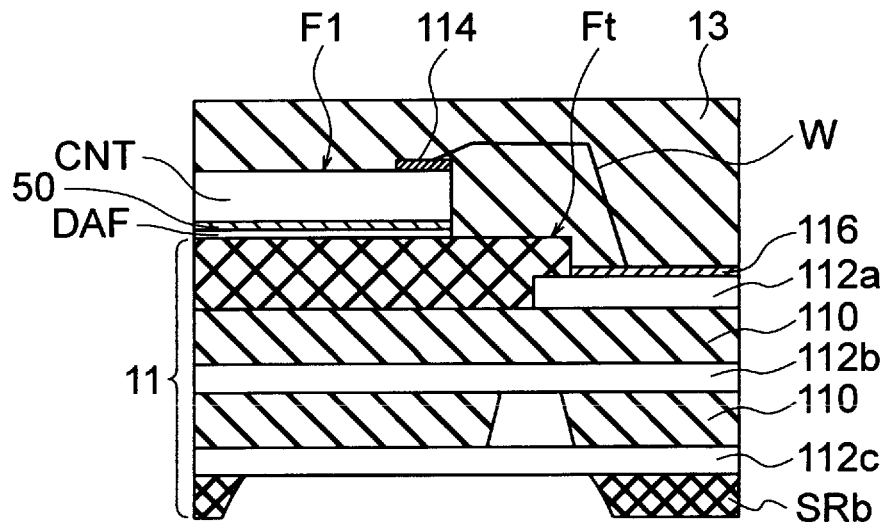
FIGS. 6A and 6B are cross-sectional views schematically illustrating the example of the method of manufacturing the semiconductor device continued from FIGS. 5A and 5B.
Figure 6B:
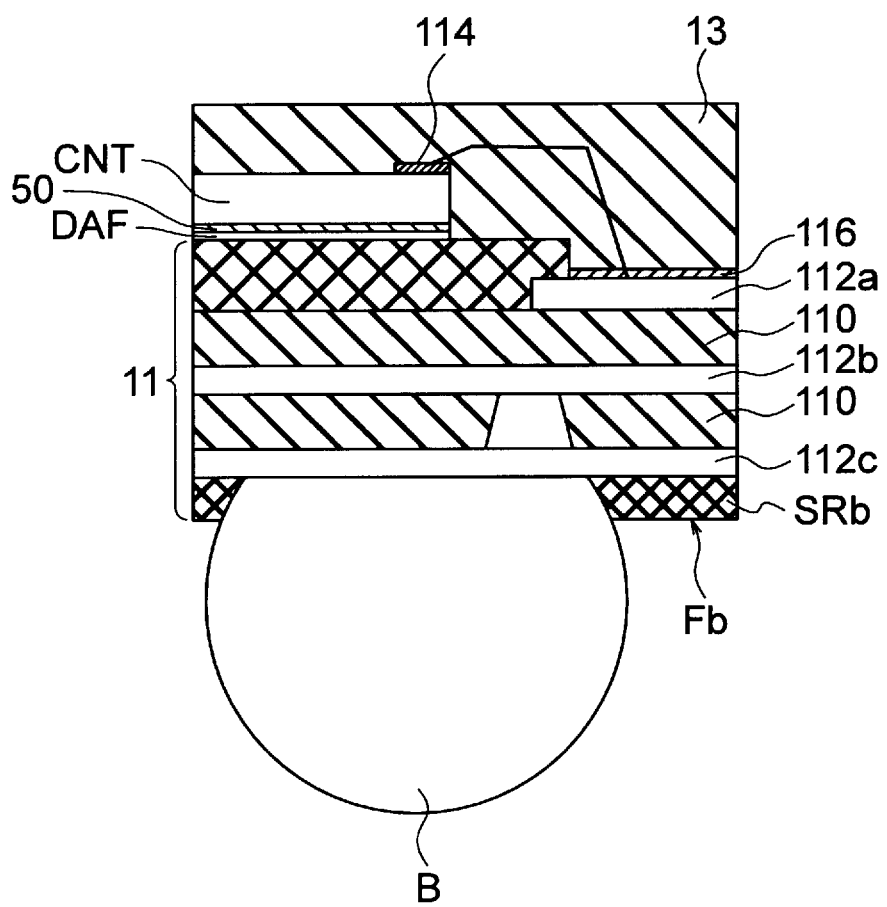

Subsequently, the resin layer 13 is attached or applied to the back surface of the lowermost memory chip CH, and the memory chip CH is placed on the memory controller CNT and the wire W. Thereby, the lowermost memory chip CH is bonded on the substrate 11, and the memory controller CNT and the wire W are sealed with the resin layer 13, as illustrated in FIG. 6A.

Subsequently, although not illustrated, a plurality of memory chips CH, having the adhesive layer DAF on the back surface thereof, are stacked on the lowermost memory chip CH. Subsequently, the plurality of memory chips CH and the substrate 11 are connected to each other by the wire W. In addition, the plurality of memory chips CH and the wire W are sealed with the resin layer 12. Thereby, a structure above the first surface F1 of the substrate 11 illustrated in FIG. 1 is formed.

Subsequently, the metal bump B is formed in a region, excluding the solder resist layer SRb. Thereby, the metal bump B is electrically connected to the wiring layer 112c, whereby the semiconductor device 1 according to the embodiment illustrated in FIG. 1 is completed.

As described above, in the semiconductor device 1 according to at least one embodiment, the metal layer 50, for which the range of α rays is shorter than for single-crystal silicon, is provided between the memory controller CNT and the substrate 11. Thereby, the metal layer 50 absorbs α rays, thereby preventing α rays from reaching the circuit such as, for example, the SRAM provided on the first surface F1 of the memory controller CNT. As a result, it is possible to prevent the loss of data in the SRAM of the memory controller CNT or malfunction of the circuit.

Figure 7:
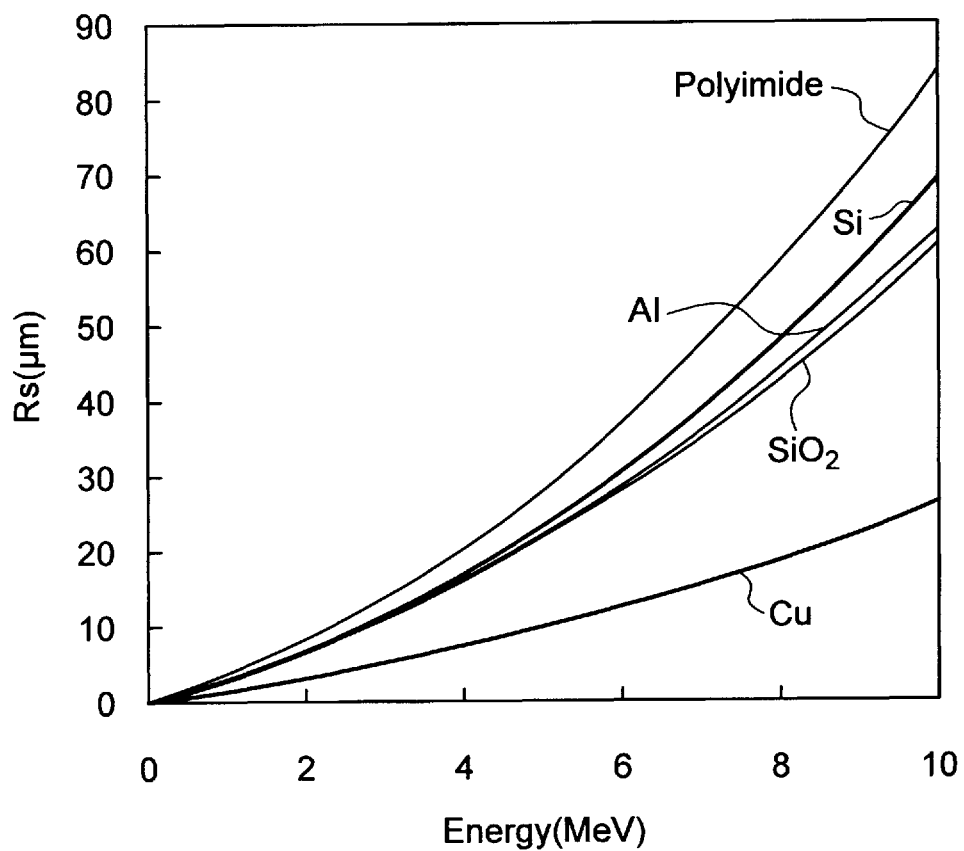
FIG. 7 is a graph illustrating a range of α rays.

FIG. 7 is a graph illustrating the range of α rays. The vertical axis represents the range of α rays. The horizontal axis represents the energy of α rays. Referring to this graph, it can be appreciated that the range Rs of α rays is clearly smaller in copper than that in single-crystal silicon, a silicon oxide layer, polyimide, or aluminum. Although not illustrated in this graph, it can be appreciated that nickel has an Rs as small as that in copper. Therefore, by providing the metal layer 50 such as copper or nickel between the memory controller CNT and the substrate 11, it is possible to reduce the thickness of the semiconductor device 1 while preventing malfunction caused by α rays from the substrate or the adhesive layer.

In addition, according to at least one embodiment, the substrate 11 may be a resin substrate including a glass fiber such as, for example, a glass epoxy resin, and an inexpensive substrate suitable for each package may be selected as the substrate 11.

Second Embodiment

Figure 8:
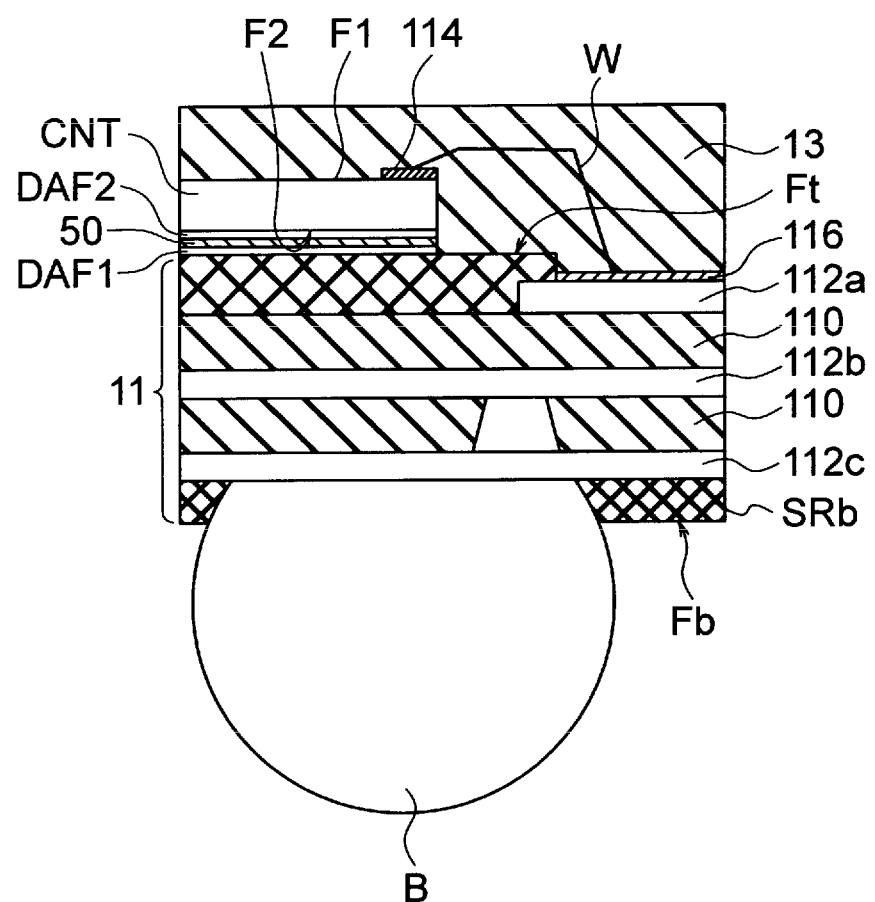
FIG. 8 is a cross-sectional view illustrating an example of a configuration of a semiconductor device according to a second embodiment.

FIG. 8 is a cross-sectional view illustrating an exemplary configuration of the semiconductor device 1 according to a second embodiment. In the second embodiment, the metal layer 50 is sandwiched between two adhesive layers DAF1 and DAF2 between the second surface F2 of the memory controller CNT and the upper surface Ft of the substrate 11.

The first adhesive layer DAF1 is provided on the upper surface Ft of the substrate 11. The second adhesive layer DAF2 is provided on the second surface F2 of the memory controller CNT. The metal layer 50 is provided between the first adhesive layer DAF1 and the second adhesive layer DAF2. That is, the metal layer 50 and the adhesive layers DAF1 and DAF2 are provided as a three-layer structure between the memory controller CNT and the substrate 11.

Other configurations of the second embodiment may be the same as corresponding configurations of the first embodiment. Thus, in the second embodiment, the same effects as those in the first embodiment may be obtained.

Figure 9A:
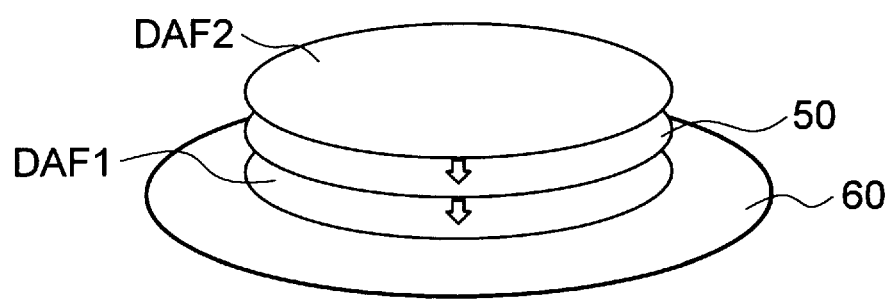
FIGS. 9A and 9B are perspective views illustrating an example of a method of manufacturing the semiconductor device according to the second embodiment.
Figure 9B:
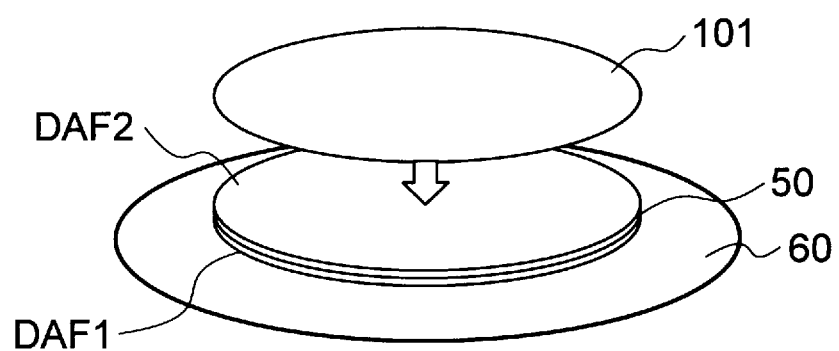

FIGS. 9A and 9B are perspective views illustrating an exemplary method of manufacturing the semiconductor device 1 according to the second embodiment. First, as described above with reference to FIG. 3A, a semiconductor element is formed on the first surface F1 of the silicon substrate 101. Subsequently, the second surface F2 of the silicon substrate 101 is polished using a CMP method, for example.

Subsequently, as illustrated in FIG. 9A, the first adhesive layer DAF1 is placed on a dicing tape 60, and the metal layer 50 is placed on the first adhesive layer DAF1. Then, the second adhesive layer DAF2 is placed on the metal layer 50.

Subsequently, as illustrated in FIG. 9B, the silicon substrate 101 is bonded on the second adhesive layer DAF2 such that the second surface F2 of the silicon substrate 101 faces the second adhesive layer DAF2 side. Thereby, a three-layer structure, which includes the first adhesive layer DAF1, the metal layer 50, and the second adhesive layer DAF 2, is formed between the second surface F2 of the silicon substrate 101 and the upper surface Ft of the substrate 11. A configuration of the metal layer 50 may be the same as that in the first embodiment.

Subsequently, as illustrated in FIG. 4B, the silicon substrate 101 is divided into individual chips by dicing. Thereafter, the semiconductor device 1 according to the second embodiment is obtained through the processes described above with reference to FIGS. 5A to 6B. Since the metal layer 50 is provided between the second surface F2 of the silicon substrate 101 and the upper surface Ft of the substrate 11, the second embodiment may obtain the same effects as those of the first embodiment.

In addition, in the semiconductor device 1 according to the first and second embodiments, the semiconductor chip, which is provided on the upper surface Ft of the substrate 11, is the memory controller CNT. Thus, the semiconductor chip, which needs to be protected from α rays, is the memory controller CNT. However, when the memory chip CH is mounted on the upper surface Ft of the substrate 11, the semiconductor chip, which needs to be protected from α rays, is the memory chip CH. That is, the semiconductor chip may be either the memory controller CNT or a stack of the plurality of memory chips CH.

In addition, in the above exemplary embodiments, the semiconductor device 1 is a semiconductor memory. However, the semiconductor device according to the embodiments may be a semiconductor device other than the semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a semiconductor chip including a semiconductor element on a first surface of the semiconductor chip, the semiconductor chip provided on the substrate such that a second surface of the semiconductor chip, opposite to the first surface, faces an upper surface of the substrate;
   a metal layer provided between the second surface of the semiconductor chip and the upper surface of the substrate; and
   a resin layer provided on the first surface of the semiconductor chip and the upper surface of the substrate, the resin layer covering the metal layer for preventing exposure to outside air,
   wherein the metal layer includes a metal material in which a range of a rays is shorter than for single-crystal silicon, and
   wherein the resin layer is directly in contact with the upper surface of the substrate.

2. The semiconductor device according to claim 1, wherein the semiconductor chip comprises at least one of a memory controller or a memory region.

3. The semiconductor device according to claim 1, wherein the semiconductor chip comprises a memory controller and a memory region.

4. The semiconductor device according to claim 1, further comprising a plurality of memory chips, and
   wherein the semiconductor chip comprises a memory controller.

5. The semiconductor device according to claim 1, further comprising an adhesive layer disposed between the metal layer and the substrate.

6. The semiconductor device according to claim 1, wherein the metal layer covers an entirety of the second surface of the semiconductor chip.

7. The semiconductor device according to claim 1, wherein, given that a density of a certain material is "p", a range of α-rays in air is "R", and an atomic weight of the material is "A", a range of α-rays in the material, "Rs", is defined by Equation 1 as follows:

$$Rs=(3.2\times10^{-4}\times R\times A^{1/2})/\rho \qquad \text{(Equation 1)},$$

wherein an Rs of the metal layer is smaller than an Rs of single-crystal silicon.

8. The semiconductor device according to claim 1, wherein the metal material is copper or nickel.

9. The semiconductor device according to claim 1, wherein the metal layer has a film thickness of 20 μm or less.

10. The semiconductor device according to claim 1, wherein the substrate is made of a glass resin material in which a resin contains a glass fiber.

11. The semiconductor device according to claim 1, further comprising:
    a solder resist layer provided on the upper surface of the substrate,
    wherein the solder resist layer includes a glass filler.

12. The semiconductor device according to claim 1, wherein the metal layer is in contact with the second surface of the semiconductor chip.

13. The semiconductor device according to claim 1, further comprising:
    a first adhesive layer provided on the upper surface of the substrate; and
    a second adhesive layer provided on the second surface of the semiconductor chip,
    wherein the metal layer is provided between the first adhesive layer and the second adhesive layer.

* * * * *